United States Patent
Karström et al.

[11] Patent Number: 5,884,493
[45] Date of Patent: Mar. 23, 1999

[54] METHOD AND DEVICE FOR OBTAINING RESERVE TIME FOR A COOLING SYSTEM

[75] Inventors: Anders Karström, Bandhagen; Lennart Ståhl, Stallarholmen, both of Sweden

[73] Assignee: Telefonaktiebolaget L M Ericsson, Stockholm, Sweden

[21] Appl. No.: 794,575

[22] Filed: Feb. 3, 1997

[30] Foreign Application Priority Data

Feb. 2, 1996 [SE] Sweden ................................. 9600395

[51] Int. Cl.[6] .................................................... F25B 7/00
[52] U.S. Cl. ............................ 62/99; 62/259.2; 62/435; 165/140
[58] Field of Search ....................... 62/59, 259.2, 435, 62/99; 165/140, 80.3

[56] References Cited

U.S. PATENT DOCUMENTS

| | | | |
|---|---|---|---|
| 4,513,574 | 4/1985 | Humphreys et al. | 62/59 |
| 4,761,967 | 8/1988 | Sumikawa et al. | 165/140 |
| 4,831,830 | 5/1989 | Swenson | 62/59 |
| 5,044,172 | 9/1991 | Inoue et al. | 62/435 X |
| 5,369,964 | 12/1994 | Mauer et al. | 62/420 |

FOREIGN PATENT DOCUMENTS

| | | |
|---|---|---|
| 445487 | 5/1986 | Sweden . |
| 2218499 | 11/1989 | United Kingdom . |
| WO93/25858 | 12/1993 | WIPO . |
| WO95/17636 | 6/1995 | WIPO . |

OTHER PUBLICATIONS

Swedish International Search Report mailed Oct. 4, 1996 corresponding to National Application No. SE 9600395–9.

Ericsson Review, Vol. No. 4, 1981, Regnar Almquist, "Kylsystem för elektroniska telefonstationer".

*Primary Examiner*—William Wayner
*Attorney, Agent, or Firm*—Burns, Doane, Swecker & Mathis, L.L.P.

[57] ABSTRACT

When in operation, devices for telecommunications installed in rooms generate a considerable amount of heat. This takes place continuously, and a maximum temperature must not be exceeded. In order to obtain reserve time for an air cooling system having a reserve time system with a guaranteed low temperature level of the liquid for the reserve time system, an evaporator (2) for the air cooling system is provided with a liquid circuit (2b) which is connected with a liquid tank (7). Liquid is circulated continuously through the evaporator with the liquid circuit, where it is cooled by the cooling medium for the air cooling system, at the same time as the inside air is cooled by the same evaporator. The continuous cooling and circulation of the liquid in the tank ensures that there is always the coldest possible liquid available when the ordinary cooling system is not working. In case of failure of the air cooling system, liquid is circulated by means of a liquid pump (6) from the tank via the evaporator provided with the liquid circuit, thus cooling the warm inside air. The heated liquid is returned to the tank. When the air cooling system is working again, it will start to fill the tank with cold liquid.

12 Claims, 1 Drawing Sheet

METHOD AND DEVICE FOR OBTAINING RESERVE TIME FOR A COOLING SYSTEM

TECHNICAL FIELD

The present invention relates to a method and a device for obtaining reserve time for a cooling system for cooling e.g. equipment for telecommunications installed in rooms.

BACKGROUND

Equipment for telecommunication installed in rooms, during operation generates a considerable amount of heat energy. This occurs continuously and the temperatures around the equipment have to be maintained within certain limits. Particularly important is that a specified maximum temperature must not be exceeded. In order to achieve this temperature regulation, usually mechanical cooling systems e.g. compressor operated evaporation systems are used. In those the warm indoor air passes an evaporator and is cooled. Thereafter the cooled air is recirculated to the room. The continous heat generation requires continuous cooling.

In case of failure of e.g. a compressor cooling system some kind of reserve system has to be activated and provide cooling of the indoor air. One method to obtain reserve cooling is to provide cool liquid in a tank. At failure of the compressor cooling system, cold liquid is pumped from said tank to an air cooler in which the indoor air is cooled and is then pumped back to the tank again. This system however, can operate only a limited time since the liquid in the tank gradually becomes warmer. Therefore a system for obtaining reserve time for cooling indoor air is discussed.

STATEMENT OF INVENTION

In order to obtain reserve time for an air cooling system by a reserve time system having a secured low level of the liquid temperature, an evaporator of the air cooling system has been provided with a liquid circuit connected to a liquid tank. The liquid is continuously circulated through the evaporator provided with the liquid circuit, where the liquid is cooled by the refrigerant of the air cooling system, simultaneously as the indoor air is cooled by the same evaporator. The continuus cooling and circulation of the liquid in the tank will secure that there all the time will be as cold liquid as possible available when the main cooling system is out of function.

At failure of the air cooling system the liquid is circulated by a liquid pump from the tank through the evaporator provided with the liquid circuit thereby cooling the warm indoor air. The heated liquid is returned to the tank. When the air cooling system functions again it will start to charge the tank with cold water.

DESCRIPTION OF AN EMBODIMENT

Figure 1:
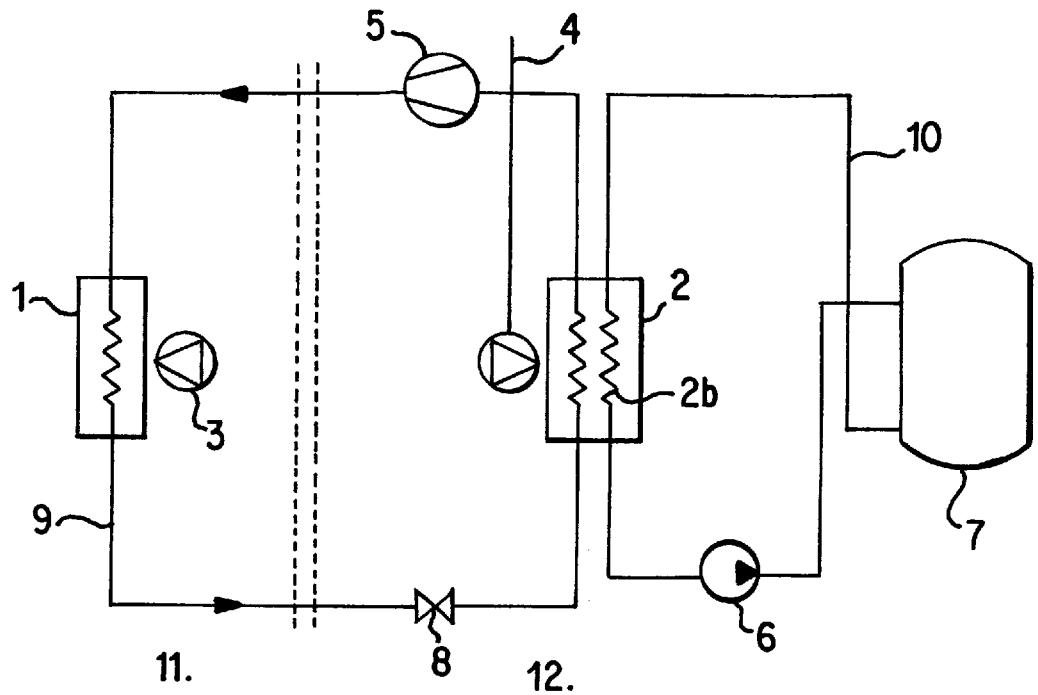
FIG. 1 illustrates a cooling system for cooling air by a reserve time according to the invention.

In FIG. 1 is in principle illustrated how a cooling system is provided with a reserve time system. The cooling system includes: a condenser 1, an evaporator 2 provided with a liquid circuit 2b, a condenser blower 3, an evaporator blower 4, a compressor 5 and an expansion valve 8. The refrigerant circuit 9 is indicated by thin lines. The condenser 1 and the condenser blower 3 are located outdoors 11. The other equipment is located indoors 12. The reserve time system includes a liquid pump 6, a liquid tank in a liquid circuit 10 and the liquid circuit 2b in the evaporator 2. The liquid circuits 2b and 10 are indicated by thick lines. The cooling system with air cools a room containing e.g. telecommunication equipment. The reserve time is obtained in that cold liquid from the tank 7 is filled with cold liquid is pumped by the pump 6 and is brought to circulate through the liquid circuit 2b of the evaporator 2, whereby the air can be cooled and be returned back to the room after cooling.

The liquid in the tank is all the time circulated through the evaporator having the liquid circuit, in which it is cooled by the cooling system of the compressor. Simultaneously the indoor air is cooled by the same evaporator. The continuous cooling and circulation of liquid to the tank secures that there always will be as cool liquid as possible available if there would occur break downs in the compressor system. At failure of the compressor system, liquid from the tank will circulate through the evaporator having the liquid circuit and thereby cool the warm indoor air with or without the evaporator blower in operation. The heated liquid is returned to the tank. When the compressor system functions again, the system starts to charge the tank with cold water. At eventual failure of the power net or the like, the liquid pump and the evaporator blower are driven from a battery through an inverter.

Figure 2:
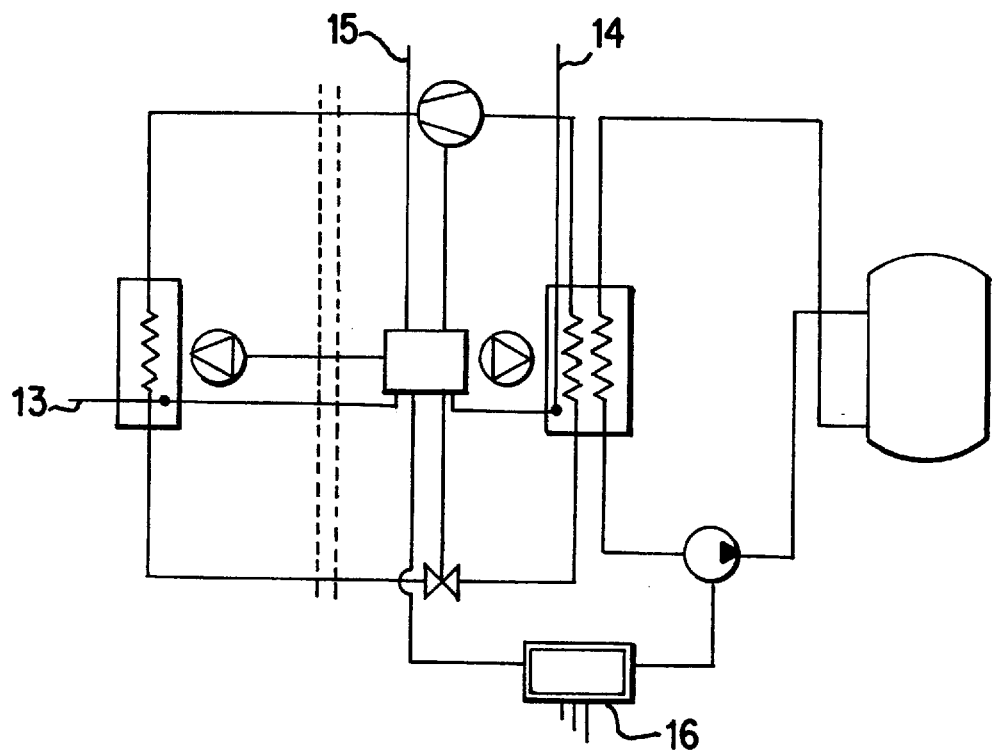
FIG. 2 illustrates a system for controlling and governing the cooling system having a reserve time system according to the invention.

In FIG. 2 a system for controlling and governing the cooling system with the reserve time system is schematically illustrated. Measure units 13, 14 are provided in the condenser 1 and evaporator 2. Measure signals from temperature sensors 13, 14 in the condenser and the evaporator with the liquid circuit, respectively are transmitted to the controlling and governing system 15 of the cooling system. With the controlling and governing system 15 the reserve time system can be connected at break-down of the cooling system. An external governing unit 16 is provided for power supply to the systems for their operation. The external governing unit 16 is connected to the reserve time system for operation of the system. The external governing unit 16 is provided to control and govern the cooling system and the reserve time system.

We claim:

1. A device for providing reserve time to a cooling system, comprising:

an evaporator located indoors and having a first and second liquid line, said first liquid line of said evaporator for circulating a first liquid cooled by an outdoor condenser of a cooling system, said second liquid line of said evaporator for circulating a second liquid, said indoors housing telecommunications equipment to be cooled by said first liquid circulating through said evaporator during a normal state of said cooling system and by said second liquid circulating through said evaporator during a failure state of said cooling system, said first liquid cooling said second liquid during said normal state of said cooling system;

a tank holding said second liquid; and a pump continuously circulating said second liquid through said evaporator and said tank regardless of an operation state of said cooling system.

2. Device for providing reserve time to a cooling system that cools an indoor area having telecommunications equipment, comprising:

a first liquid circuit having a compressor, a condenser, an expansion valve, and an evaporator;

a second liquid circuit in liquid communication with said evaporator and having a tank and a pump, said pump continuously circulating a liquid contained in the second liquid circuit regardless of an operation state of the cooling system, said first liquid circuit cooling the liquid in said second liquid circuit and cooling said indoor area when said first liquid circuit is operating, and said second liquid circuit cooling said indoor area when said first liquid circuit is not operating.

3. Device according to claim 2, further comprising an evaporator blower to be operated at said failure state of the cooling system.

4. Device according to claim 2, further comprising an external governing unit for operation of the system.

5. Device according to claim 4, further comprising measure units provided in the condenser and the evaporator.

6. Device according to claim 4, wherein the external governing unit governs the operation of the cooling system and the device for providing reserve time to the cooling system.

7. A method of providing reserve time to a cooling system that cools an indoor area having telecommunications equipment, comprising the steps of:

circulating a first liquid through a first liquid circuit including a condenser located outdoors and an evaporator located in the indoor area;

cooling the indoor area with said first liquid;

continuously circulating a second liquid through a second liquid circuit regardless of an operation state of said first liquid circuit;

cooling said second liquid in said second liquid circuit with said first liquid; and cooling said indoor area with said second liquid when said first liquid circuit is not operating.

8. The method according to claim 7, wherein said second liquid circuit includes said evaporator such that said second liquid is continuously circulated through said evaporator.

9. The method according to claim 8, wherein said second liquid is continuously circulated with a pump.

10. The method according to claim 8, wherein said second liquid is either cooled by said first liquid circulating through said evaporator or is cooling said indoors and said telecommunications equipment with said evaporator.

11. The method according to claim 7, wherein said circulating of said second liquid is completed by a pump powered by a battery source during a failure operation state of said cooling system.

12. A device for providing reserve time to a cooling system, comprising:

an evaporator located indoors and having a first and second liquid line, said first liquid line of said evaporator for circulating a first liquid cooled by an outdoor condenser of a cooling system, said second liquid line of said evaporator for circulating a second liquid;

a tank holding said second liquid; and a pump continuously circulating said second liquid through said evaporator and said tank regardless of an operation state of said cooling system, said first liquid cooling said second liquid and said indoors when said first liquid is circulating through said first liquid line, and said second liquid cooling said indoors when said first liquid is not circulating through said first liquid line.

* * * * *